United States Patent [19]

Chiron et al.

[11] Patent Number: 4,703,266

[45] Date of Patent: Oct. 27, 1987

[54] GRADIENT METER WITH THIN MAGNETIC LAYER

[75] Inventors: Guy Chiron, Gieres; André Dumont, St. Egreve, both of France

[73] Assignee: Commissariat a l'Energie Atomique, Paris, France

[21] Appl. No.: 240,472

[22] Filed: Mar. 2, 1981

[30] Foreign Application Priority Data

Mar. 17, 1980 [FR] France ............................... 80 05907

[51] Int. Cl.[4] ........................................... G01R 33/02
[52] U.S. Cl. .................................... 324/249; 324/253
[58] Field of Search ......................... 324/249, 258, 260

[56] References Cited

U.S. PATENT DOCUMENTS 3,919,630 11/1975 Oshima et al. ...................... 324/249
3,931,572 1/1976 Chiron et al. ...................... 324/249

Primary Examiner—Theodore M. Blum
Attorney, Agent, or Firm—Kerkam, Stowell, Kondracki & Clarke

[57] ABSTRACT

Gradient meter to measure the spatial derivatives $$\Delta Hi/\Delta j \ (i=x, y, z \ ; j=x, y, z)$$

of a magnetic field.

This gradient meter comprises two magnetic sonds ($7a$, $7b$) with thin layer, of which the geometric axes of the counterreaction windings are aligned in the direction of axis i, said sonds being spaced from each other along the axis j, the counterreaction current of the first sond being injected in the second sond, the counterreaction current of said second sond being then representative of the value $$\Delta Hi/\Delta j$$

to be measured.

2 Claims, 7 Drawing Figures

GRADIENT METER WITH THIN MAGNETIC LAYER

It is known that a magnetic field $\vec{H}$ is defined in a general way by three components $H_x, H_y$ and $H_z$ for each point M of the space as well as by its nine first spatial derivatives:

$$H_{ij} = \delta H_i/\delta_j \; i=x, y, z; j=x, y, z.$$

which characterize the evolution of its module in each of the three directions of space around M under consideration. The preceding nine spatial derivatives constitute a tensor that is currently called for convenience, the gradient of magnetic field.

The present invention has for an object providing a gradient meter (that is, apparatus capable of furnishing the measurement of one at least of these nine terms).

The gradient meter of the present invention is derived from the magnetometer which is the object of French Pat. No. 7231277 filed Sept. 4, 1972 by Commissariat A L'Energie Atomique in the sense that it utilizes the same magnetic layer as the magnetometer and utilizes measuring sonds of the same general nature as those described in this patent.

To begin, it should be recalled, by referring to schematic FIGS. 1 to 3 herewith, that a certain number of elements are known relating to the thin layers as used, their processes of excitation and the methods of detection of magnetic fields utilizing these thin layers.

The known thin magnetic layers, utilized in the gradient meter of the present invention, are of the type of those which are shown in FIG. 1 and comprise essentially on a cylindrical support 1 a magnetic layer 2 having the form of a cylinder of revolution on axis Z and of thickness e. This thin layer 2 is anisotropic, that is, that is possesses for each of its points M an axis of easy magnetization or easy axis AF, directed tangentially to the surface and perpendicular to axis Z, and an axis of difficult magnetization, or a difficult axis (designated by AD) parallel to axis Z of cylinder 2 constituting the thin layer. In other words, and by extension of language, it can be said that the axis of easy magnetization of the layer being contained in its plan is a closed circular axis in the different right sections of cylinder 2.

The exploitation in an object of measuring of a magnetic field of a thin layer conforms to that of FIG. 1 necessitating, for measuring the component of the magnetic field parallel to axis Z of difficult magnetization of the thin layer, a certain number of excitation windings or for sampling which are now referred to by considering FIG. 2.

In FIG. 2, there is shown a magnetic captor or sond with a thin layer of a type known in itself in which is identified first at the center the thin layer 2 surrounded by an excitation winding 3 by which there is superimposed an alternating field of small amplitude parallel to the component of the field to be measured. This magnetic field inducts in layer 2 an electromotive force that is measured by the use of a winding 4 having an axis parallel to the easy axis of layer 2 and which can comprise, in accordance with the case, a certain number of turns to further increase the amplitude of the received alternating signal. Finally, a saturation wire 6 coaxial to the thin layer 2 provides an initial saturation of layer 2 by applying to it a magnetic field along its axis of easy magnetization.

The theory of the magnetometer utilizing the sond of FIG. 2 and which will be found developed in French No. 72.31.277 shows that, assuming several approximations entirely acceptable in the general situation, the amplitude of the harmonics 1 and 3 of the alternating voltage received in the sampling winding 4 is proportional to the component of the field to be measured along axis ZZ' of the sond of FIG. 2, which provides possible means for proceeding to the measurement of such a component.

In current manner nevertheless it is preferred for reasons of simplicity, to refer to a zero method for measuring the component of the field along the difficult axis of the sond and one utilizes for this the electrical arrangement of FIG. 3.

In FIG. 3, sond 7 is shown schematically conforming to that previously described in FIG. 2 and providing at its output 4, corresponding to the sampling winding, the alternating signal. This alternating signal of pulsation w, identical to that of the excitation signal injected through the winding 3 of FIG. 2, then goes to an amplifier 25 of gain T in open ring. Amplifier 25 which comprises itself a selective amplifier 8, synchronous detector 9 and an integrator 10 in series, delivers as an output in conductor 11, a continuous voltage proportional by definition to the component of the field to be measured along the axis of difficult magnetization of sond 7. This continuous voltage is accessible on an output 12 branched in derivation on conductor 11. The method of measurement utilized in the scheme of FIG. 3 being a zero method comprising a counterreaction, the electric scheme described above is completed by a conductor 13, a variable resistance 14 in series with this conductor and a counterreaction winding 5 surrounding sond 7 and coaxial with it. If V is the voltage present in line 11 in output from amplifier 25, and $I_{CR}$ the current which passes through counterreaction winding 5 then this current compensates, by annulling as closely as possible, the component of the field to be measured. $I_{CR}$ is determined by the characteristics of winding 5 and the value of the field to be compensated and V is adjusted utilizing resistance 14.

If H is called the component along the axis of sond 7 of the field to be measured and H' the field of counterreaction in the opposite sense created in winding 5 by the current $I_{CR}$, the field of error is defined as $h = H - H'$ with H' equal to Th. It can then be deduced:

$$H' = T/(1+T) \cdot H$$

This shows that the component H' is proportional to the component H and that the value of the current of counterreaction $I_{CR}$ is thus closely proportional when equilibrium is attained, to component H of the field to be measured.

Applicant has established that it was possible to utilize, by combining them in a certain way between themselves, several magnetometric sonds with thin layers of known type which have previously been referred to to easily obtain a gradient meter able to measure the first spatial derivatives of the magnetic field existing at any point of the space along the three directions Ox, Oy and Oz.

The gradient meter of the present invention utilizes magnetic sonds having thin layers of the type which comprise:

a magnetic layer of cylindrical form of revolution of which the difficult axis of magnetization is parallel to the axis of the cylinder and for which the axis of easy magnetization is circular, closed on itself in the plane of the layer along a right section of the cylinder, and said layer being initially saturated along its axis of easy magnetization;

an excitation winding with axis parallel to the axis of the cylinder to create, along the direction of difficult axis, an alternating excitation field at a frequency f;

a winding having an axis paralel to the easy axis to sample the alternating signal at one of the frequencies f or 3f from the preceding excitation;

a counterreaction winding in which is reinjected a continuous current as a function of the amplitude of the preceding alternating signal and of intensity such that one annuls as closely as possible the component of the external magnetic field to be studied parallel to the axis of difficult magnetization of the thin layer; and further characterized in that, to measure the component $$\delta H_i/\delta j$$

of the gradient of field H, it comprises two magnetic sonds with a thin layer of the preceding type, of which the geometric axes of the counterreaction windings are aligned along the direction of the axis i, the said sonds being spaced one from the other along the axis j, a counterreaction current of the first sond being injected in the second sond, the counterreaction current of the second sond being then representative of the value $$\delta H_i/\delta j$$

to be measured.

The remarkably simple result, in accordance with which it is sufficient for two magnetic sonds directed in the space along axis i and spaced along the axis j, the second receiving in its counterreaction winding the counterreaction current of the first to measure the component of gradient $$\delta H_i/\delta j$$

can be explained in the following way.

If Ox is the direction of the space along which is oriented the axis of the counterreaction winding of the first sound situated at a point where it is desired to measure the gradient of the magnetic field, the counterreaction field $\vec{H}$ created in this winding in accordance with the showing of FIG. 3 is thus always directed along Ox. A thin magnetic layer constituting the active element 7 of the sond is situated, as shown in FIG. 3, at the interior of the counterreaction winding 5 and is placed in such a way that its difficult axis coincides as closely as possible with the axis Ox of the counterreaction field $\vec{H_{CR}}$. This condition cannot always be exactly met and it is only approximately that the difficult axis of the thin magnetic layer is aligned in the direction Ox with the axis of the counterreaction winding of field. If a vector $\vec{S}$ is assumed to be aligned on the difficult axis of the thin layer, that is to say having the coordinates:

$$\vec{S} \begin{cases} S_x \#|S| = S \\ S_y << S_x \\ S_z << S_x \end{cases}$$

it represents the sensitivity of the thin layer at the field to be measured and the equation:

$$\vec{S} \cdot (\vec{H} - \vec{H_{CR}}) = 0 \qquad (1)$$

is satisfied.

In effect, the equation (1) expresses that the field resulting from the application of counterreaction to the component to be measured should equal zero or be perpendicular to the vector $\vec{S}$ so that there is no signal induced in the thin layer by this component, that is to say in other words, so that the zero method chosen for the measurement is rigorously applied.

In these conditions, if one calls $H_x, H_y, H_z$ the components of field $\vec{H}$ to be measured at the point where the first thin layer is located, a simple calculation, beginning with equation (1) above provides under the form of equation (2) the relation connecting at the point considered the counterreaction field $H_{CR}$, the field $\vec{H}$ and a vector $\vec{\sigma}$ defined in accordance with equation (3):

$$H_{CR} = \vec{\sigma} \cdot \vec{H} \qquad (2)$$

$$\vec{\sigma} \begin{cases} \sigma_x \#1 \\ \sigma_y = S_y/S \\ \sigma_z = S_z/S \end{cases} \qquad (3)$$

If one now places a second field captor or sond of thin layer identical to the preceding one having the same orientation and situated, along axis Ox, at a distance $\Delta X$ from the first, and supposing that their counterreaction field windings are perfectly aligned along axis Ox, the invention consists in injecting the counterreaction current $I^1_{CR}$ of the first counterreaction winding in the second winding through an appropriate electric circuit. One can then write, by utilizing the indices 2 for the elements of the second captor analogous to those of the first, a set of equations as follows:

$$\vec{S_1} \cdot (\vec{H^1} - \vec{H^1_{CR}}) = 0 \qquad (4)$$

$$\vec{S_2} \cdot (\vec{H^2} - \vec{H_R^2} - \vec{H^2_{CR}}) = 0 \qquad (5)$$

equations in which $H^1$ and $H^2$ designate, respectively, the magnetic field in the neighborhood of each of the two sonds, the equations (4) and (5) deriving directly from the application to each of the sonds of the equation (1).

If one now designates by n the ratio (in general very little different from unity) of the numbers of turns respectively of the counterreaction windings of the two sonds, there obviously exists a relation between the counterreaction field of the first captor and a part of that of the counterreaction winding of the second captor, since the current of the first winding is injected in the second. One can thus write, by calling $H_R$ the corresponding magnetic field cut off at the component along the difficult axis at the level of the second captor, the following equation:

$$H_R^2 = nH^1_{CR} \qquad (6)$$

By applying equation (2) to the equations (4) and (5) and taking into account equally equation (6), a calculation that is not necessary to develop here shows that the total counterreaction field of the second sond can then, neglecting quantities of the second order, be written in the form:

$$H_{CR}^2 \# \Delta_x \frac{\delta H_x}{\delta_x} + \vec{s} \cdot \vec{H};  \quad (7)$$

in which formula the vector S has for coordinates:

$$\vec{s} \begin{cases} n - 1 \\ \sigma_y^2 - n\sigma_y^1 \\ \sigma_z^2 - n\sigma_z^1 \end{cases}$$

In this formula, (7) the vector $\vec{s}$ has components of the second order with respect to those of the vector $\vec{H}$ and one can then deduce that, in a first approximation, a compensation field, or which amounts to the same thing the compensation current, of the second sond is directly proportional to the value $$\delta H_x/\delta x$$

that one seeks precisely to measure. The complementary term $\vec{s} \cdot \vec{H}$ of equation (7) thus self-analyses as a systematic error of the second order that one can, in first approximation, overlook.

If for particular reasons, one wishes to take into account this systematic error, one can then have recourse to a secondary characteristic of the invention.

In accordance with this secondary characteristic, which is very important for the gradient meter of the invention, one equilibrates the apparatus, that is to say that one renders minimal the error signal caused by non-rigorous alignment of the respective axes of each of the counterreaction winding (axis i) and of the direction of difficult magnetization of the corresponding thin layer. To this end, the gradient meter comprises in addition to the first sond two identical auxiliary sonds disposed at the same point and oriented along two complementary orthogonal axes from the first axis, each of the three sonds then measuring one of the components $H_x, H_y, H_z$ of the field to be studied at the point considered, as well as means to create and inject in the counterreaction winding of the second sond remote from the three preceding ones, continuous current proportional to the measured values of $H_x, H_y$ and $H_z$.

In accordance with formula (7), it is obvious that to reduce the error signal resulting from the sensitivity of the gradient meter at field $\vec{H}$, it is necessary to reduce the vector $\vec{S}$. To this end, one utilizes the measurements of the components $H_x, H_y$ and $H_z$ of the local field furnished by the first sond and two identical auxiliary sonds, orthogonal to the first along the two other directions of the space, and one injects in the counterreaction winding of the field of the second sond spaced by $\Delta X$ from the three first sonds currents proportional to the values of the three preceding components. In this way, one thus cuts off at the level of the second sond away from the three first sonds a counterreaction field $\vec{H_e}$ parallel to the axis Ox and of amplitude:

$$H_e = aH_x + bH_y + cH_x \quad (8)$$

equation (5) then becomes:

$$\vec{S_2} \cdot (\vec{H}^2 - \vec{H_R}^2 - \vec{H_e} - \vec{H_{CR}^2}) = 0$$

The relation (7) remains unchaged, but the components of the vector $\vec{s}$ are thus written:

$$\vec{s} \begin{cases} (n-1) - a \\ \sigma_y^2 - n\sigma_y^1 - b \\ \sigma_z^2 - n\sigma_z^1 - c \end{cases} \quad (9)$$

The relation (9) above shows that one can, by adjusting the coefficients a, b, c manually or automatically annul or at least largely decrease the components of the vector S, that is to say, render null or minimal the systematic error or reading which results from the second term of equation (7).

The explanations which have just been made concern the measurement of the first spatial derivatives of the magnetic field of the form $$\delta H_i/\delta i$$

sometimes called "diagonal terms". But it is obvious that one can in the same manner measure the non-"diagonal" terms of the form $$\delta H_i/\delta j$$

in which j is different from i.

Finally, it must also be noted, in accordance with the embodiments proposed for the gradient meter of the invention, that it can be presented in equilibrated form, that is to say provided with structure for correction of systematic error described above, with 4 to 12 magnetic sonds situated on a support to fix the three directions of space (for example a parallelopipedal bar, (cube or parallelopiped).

By way of example, it will be shown that by utilizing four sonds distributed at the two extremities of a parallelopipedal bar comprising three sonds at the first end and a fourth at the second end, one can measure the gradient of the magnetic field along the direction of the parallelopipedal bar.

It can easily be seen from the preceding explanation that with a gradient meter comprising a parallelopipedal bar and six sonds distributed three by three at each extremity, it is possible to measure three of the components of the gradient of a magnetic field and that by utilizing apparatus which comprises twelve captors connected three by three at four adjacent summits of a cube, one can easily measure the nine components of gradients of a magnetic field.

Outside of its simplicity of conception and of construction, the gradient meter of the invention offers, with respect to embodiments which would utilize two magnetometric sonds spaced from each other to determine the difference of their measurements, a certain number of very substantial advantages among which can be cited:

the possibility of measuring gradients of very small amplitude on the order of, for example, one $\gamma$, which is appropriate for the terrestrial field. If one utilizes on the contrary a differential method with the aid of two magnetometers, even having good performance, that is to say that each between them would lead to an error of measurement of $10^{-4}$ on the amplitude of the field, the absolute error would be 5 γ and the measurement of the gradient would then be totally inaccessible because literally it would be buried in the error of measurement of the magnetometer;

the ratio of the output voltage to the value of the gradient is much superior to what it would be with a classic magnetometer because there exists an amplification of the output signal of each sond to obtain the reading in form of a zero method;

this amplification is thus "gratuitous" in whatever form.

However, the invention will be better understood to the reader in following description of several examples and embodiments of the gradient meter which are given by way of description and not limitation. The description which follows will be made with reference to FIGS. 4 to 6 in which.

Figures 1, 2:
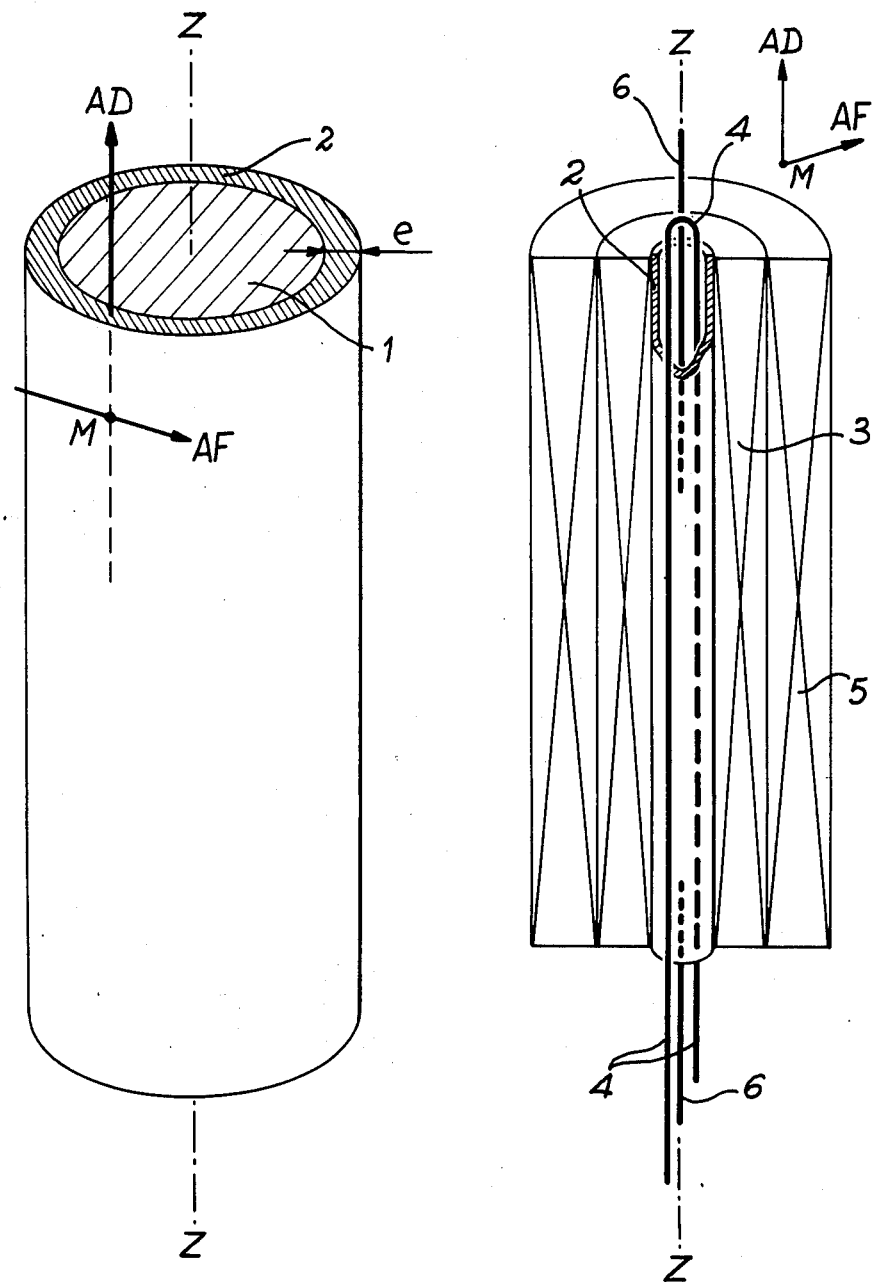
Figure 3:
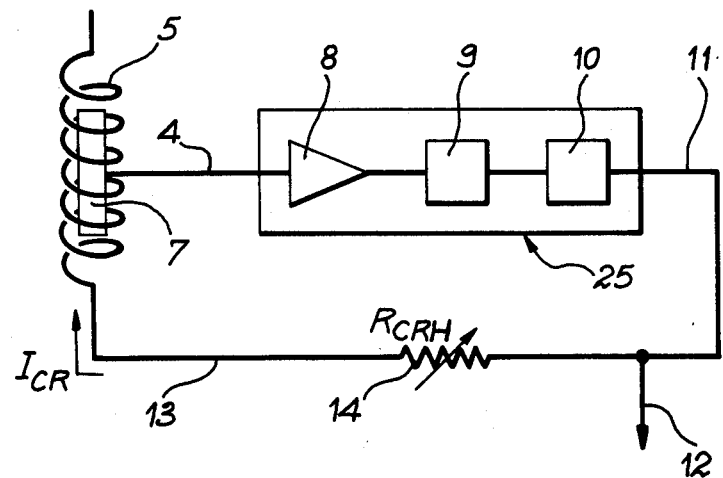
Figure 4A:
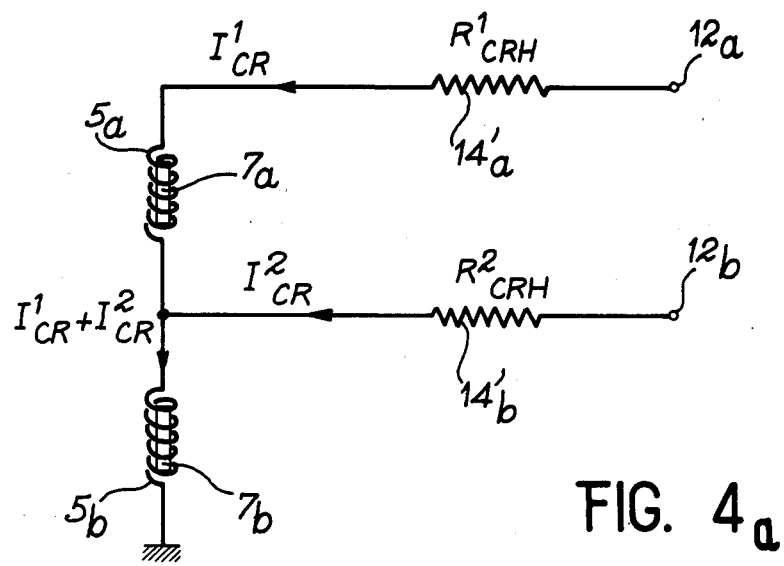
FIG. 4a shows the scheme of electric mounting of two magnetometric sonds aligned in accordance with the invention.

In FIG. 4a, there is shown two sonds 7a and 7b having counterreaction coils 5a and 5b. In accordance with the invention, these coils 5a and 5b, as well as in every possible way, sonds 7a and 7b are aligned in the same direction of the space to measure the gradient of the magnetic field in which they are located in the same direction. Points 12a and 12b corresponding to the electronic outputs seen in FIG. 3 for each of sonds 7a and 7b and resistances 14a and 14b allow equilibration of the counterreaction signal to compensate as exactly as possible the component of the field to be measured. The arrangement of FIG. 4a clearly shows that the counterreaction of current $I_{CR}{}^1$ traversing the first coil 5a is also introduced in the second coil 5b mounted in series with the first.

Figure 4B:
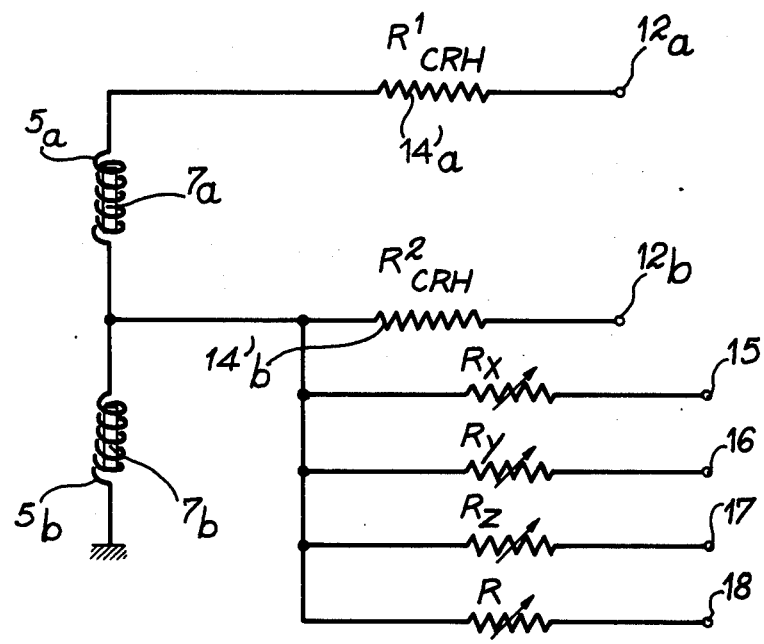
FIG. 4b represents the electric mounting of the same sonds as those of FIG. 4a, the assembly this time being provided with a correction device to equilibrate the apparatus and reduce to minimum the systematic error.

As seen in FIG. 4b the assembly of elements of FIG. 4a is shown to which has been added corrective means comprising four variable resistances in parallel $R_x, R_y, R_z$ and R which are utilized in the following way.

As explained above, three supplementary sonds situated at the same level as the first sond 7a measure respectively the components $H_x, H_y, H_z$ of the field at the point and their electronic outputs (identical to output 12 of FIG. 3) are shown in FIG. 4B at points 15, 16 and 17. The input 18 provides, through the variable resistance R, regulation of zero of the measure of gradient. In varying each of the resistances $R_x, R_y, R_z$, one brings each of the coefficients a, b and c from formula (8) to the desired value so that the equilibrium field $H_e$ has the desired value and eliminates the systematic error.

Figure 5:
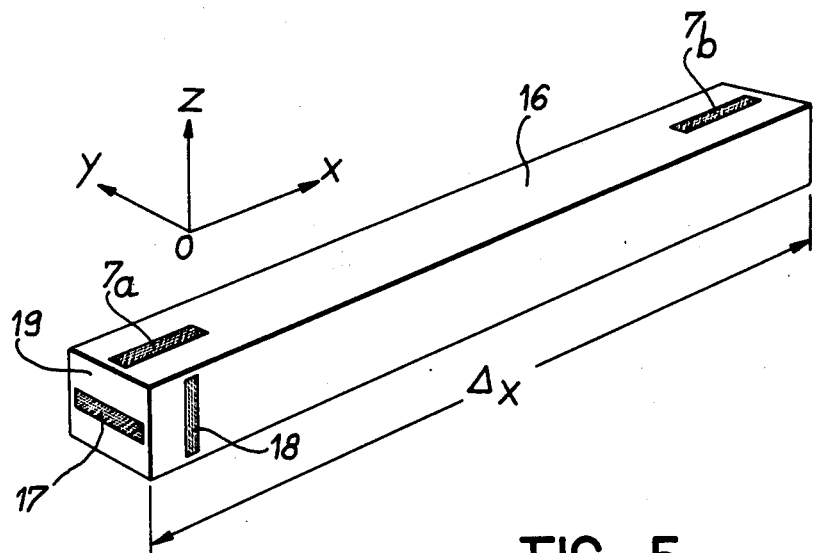
FIG. 5 shows a possible embodiment with four captors or sonds at two extremities of a bar of parallelopipedal form.

In FIG. 5, four captors are seen situated at the extremities of a parallelopipedal bar 16 of nonmagnetic material. Bar 16 has its edges oriented in accordance with the three directions of the space Ox,Oy,Oz. In FIG. 5 is seen sonds 7a, 7b of FIG. 4 of which the counterreaction windings 5a and 5b are not shown, are strictly aligned along axis Ox, the arrangement of FIG. 5 further comprising two other identical sonds at 17 and 18 placed at the same point i.e., location on the bar as first sond 7a along the other perpendicular directions of the space, that is, direction Oy and direction Oz. The embodiment of FIG. 5 provides, utilizing the scheme described in FIG. 4b, for measuring the gradient of the magnetic field $\vec{H}$ at the extremity 19 of bar 16 along the direction Ox, that is to say the value $$\delta H_z/\delta x$$

with the exactness determined by the equilibration of the gradient meter.

Figure 6:
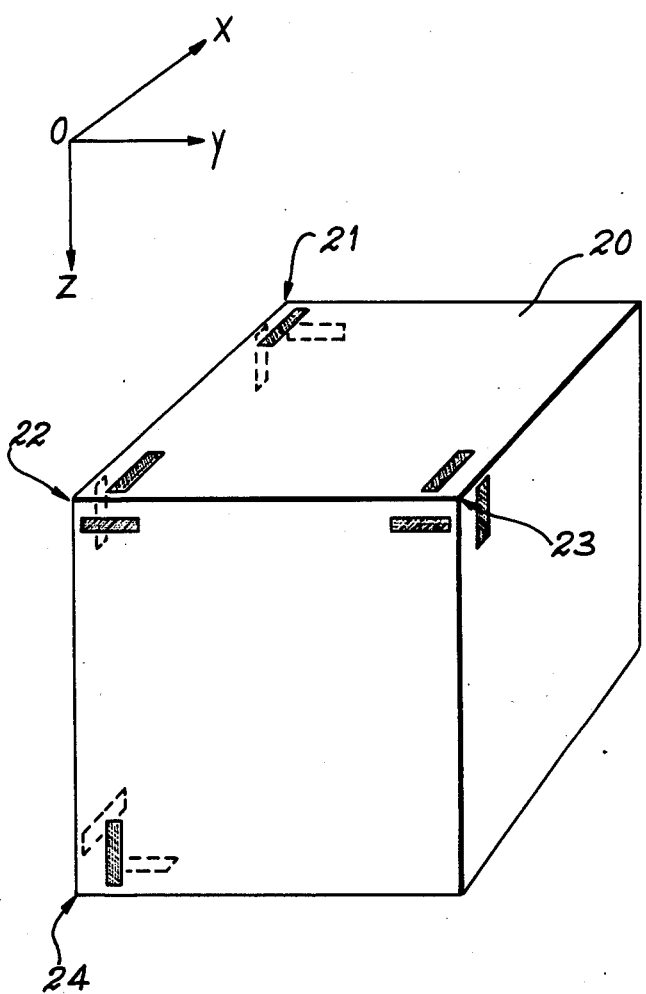
FIG. 6 represents an assembly comprising twelve sonds situated three by three at the four adjacent summits of a support in the form of a cube.

In FIG. 6 there is shown a magnetic support 20 in the form of a cube the edges of which are parallel to the three directions of space Ox,Oy and Oz.

At the consecutive summits 21, 22 and 23 of this cube, there are located three magnetometric sonds with thin layers for which the electric connections in accordance with the invention provide for measuring with equilibration of the gradient meter the nine components of gradient of the magnetic field at summit 22. To this end, the twelve sonds as shown work as in the example of FIG. 5 in association at distance, each couple of two sonds aligned along a direction measuring the gradient of field along this direction and the two adjacent sonds serving for the correction of equilibration.

We claim:

1. Gradient meter to measure the spatial derivatives $$\delta H_i/\delta j \ (i=x, y, z; j=x, y, z)$$

of a magnetic field H utilizing magnetic sonds with a thin layer of the type which comprises:

a magnetic layer of cylindrical form of revolution, the magnetic layer having an axis of difficult magnetization parallel to the axis of the cylinder and an axis of easy magnetization that is circular in a plane of the layer in a right section of the cylinder, said layer being initially saturated along its axis of easy magnetization, an excitation winding with an axis parallel to the axis of the cylinder to create, along the direction of the difficult magnetization axis, an alternating excitation field having frequency f, a winding with an axis parallel to the easy magnetization axis to sample an alternating signal at one of the frequencies f or 3f produced by the excitation, a counterreaction winding with a geometric axis in which is injected a continuous counterreaction current derived from the alternating signal after amplification, detection and integration, and of intensity such that the current substantially annuls a component of the magnetic field that is parallel to the axis of difficult magnetization of the thin layer, characterized in that, to measure a component $$\delta H_i/\delta j$$

of the gradient of field H, the gradient meter comprises first and second such magnetic sonds having the geometric axes of their counterreaction windings aligned along the direction of an axis i, said sonds being spaced from each other along an axis j, the counterreaction windings being connected together such that the counterreaction current of the first sond is injected in the second sond, and such that the counterreaction current of the second sond represents the value $\delta H_i / \delta j$ to be measured.

2. A gradient meter as described in claim 1, characterized in that to equilibrate the meter to render minimal an error signal caused by inexact alignment of the respective axes of each counterreaction winding along the axis i and of the axes of difficult magnetization of the corresponding thin layers, the meter further comprises two identical auxiliary sonds disposed at the same location as the first sond and oriented in accordance with two complementary orthogonal axes to the axis of the first sond such that each of the three sonds measures one of the components $H_x$, $H_y$, $H_z$ of the field at the location, and means for injecting in the counterreaction winding of the second sond spaced from said location, continuous currents proportional to the measured values of $H_x$, $H_y$ and $H_z$.

* * * * *